(12) United States Patent
Sato et al.

(10) Patent No.: US 7,075,149 B2
(45) Date of Patent: Jul. 11, 2006

(54) SEMICONDUCTOR DEVICE AND ITS MANUFACTURING METHOD

(75) Inventors: Shingo Sato, Kanagawa (JP); Atsuko Yamashita, Kanagawa (JP); Hideki Okumura, Kanagawa (JP); Kenichi Tokano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/844,323

(22) Filed: May 13, 2004

(65) Prior Publication Data

US 2005/0006699 A1 Jan. 13, 2005

(30) Foreign Application Priority Data

May 13, 2003 (JP) ............................. 2003-134293

(51) Int. Cl.
*H01L 29/76* (2006.01)
(52) U.S. Cl. ...................... 257/335; 257/341; 257/374; 438/207; 438/218; 438/219
(58) Field of Classification Search ................ 438/223, 438/224, 245, 360, 207, 218, 219; 257/341, 257/335, 374
See application file for complete search history.

(56) References Cited

U.S. PATENT DOCUMENTS

| 5,216,275 | A | 6/1993 | Chen |
| 6,410,958 | B1 * | 6/2002 | Usui et al. .................. 257/329 |
| 6,750,508 | B1 | 6/2004 | Omura et al. |

FOREIGN PATENT DOCUMENTS

JP 2003-229569 8/2003

OTHER PUBLICATIONS

S. Yamauchi, et al., Proceedings of 2001International Symposium on Power Semiconductor Devices & ICs, pp. 363-366, "Fabrication of High Aspect Ratio Doping Region by Using Trench Filling of Epitaxial SI Growth", 2001.

* cited by examiner

*Primary Examiner*—Fetsum Abraham
(74) *Attorney, Agent, or Firm*—Oblon, Spivak, McClelland, Maier & Neustadt, P.C.

(57) ABSTRACT

A semiconductor device comprises: a semiconductor layer of a first conductivity type; a first semiconductor pillar layer of the first conductivity type; a second semiconductor pillar layer of a second conductivity type; a third semiconductor pillar layer of the first conductivity type; a forth semiconductor pillar layer of the second conductivity type; a fifth semiconductor pillar layer of the first conductivity type provided on the major surface of the semiconductor layer; a first semiconductor base layer of the second conductivity type provided on the second semiconductor pillar layer; a second semiconductor base layer of the second conductivity type provided on the forth semiconductor pillar layer; first semiconductor region of the first conductivity type selectively provided on a surface of the first semiconductor base layer; second semiconductor region of the first conductivity type selectively provided on a surface of the second semiconductor base layer; gate insulating film provided on the first semiconductor base layer between the first semiconductor region and the first semiconductor pillar layer and between the first semiconductor region and the third semiconductor pillar layer, and provided on the second semiconductor base layer between the second semiconductor region and the third semiconductor pillar layer and between the second semiconductor region and the fifth semiconductor pillar layer; and gate electrode provided on the gate insulating film. Each width of the first through fifth semiconductor pillar layers seen in a perpendicular direction to interfaces of p-n junctions formed among the first through fifth semiconductor pillar layers respectively is 10 microns or less.

18 Claims, 16 Drawing Sheets

SEMICONDUCTOR DEVICE AND ITS MANUFACTURING METHOD

CROSS-REFERENCE TO RELATED APPLICATIONS

This application is based upon and claims the benefit of priority from the prior Japanese Patent Application No. 2003-134293, filed on May 13, 2003; the entire contents of which are incorporated herein by reference.

BACKGROUND OF THE INVENTION

The present invention relates to a semiconductor device and a method of manufacturing the same, and more particularly, it relates to a semiconductor device which has power-MOSFET (Metal-Oxide-Semiconductor Field Effect Transistor) type structure and to its manufacturing method.

The conventional power metal-oxide semiconductor field effect transistor is manufactured, for example, by forming an n-type epitaxial-growth layer on an $n^+$-type substrate of high concentration and by forming MOSFET structure on the surface thereof. In this structure, a high breakdown voltage can be realized by extending a depletion layer in the n-type epitaxial-growth layer. However, since a resistance of the n-type epitaxial-growth layer for realizing a high breakdown voltage is high, the resistance of the element (called $R_{on}$: "ON resistance" etc.) in an ON state will become high.

Then, in order to improve this trade-off relation, the MOSFET in which p-n stripe and pillar structure are provided has been proposed. In these MOSFETs, the MOSFET is formed in the upper part of the p-n stripe or the p-type pillar. The $R_{on}$ can be lowered by making the n-type layers of comparatively high-concentration as current paths, and the breakdown voltage can be raised by making the p-n pillar into perfect depletion.

However, in the case of such structures, the pillar structure has been fabricated by repeating ion implantation and epitaxial growth, and has been formed by performing prolonged activation processing at high temperature to the last. For this reason, accuracy of the alignment was limited between the process of the ion implantation and the process of the epitaxial growth, and the pillar was expanded by activation processing. Therefore, it was difficult to form the pillar with high density.

SUMMARY OF THE INVENTION

According to an aspect of the invention, there is provided a semiconductor device comprising:

a semiconductor layer of a first conductivity type;

a first semiconductor pillar layer of the first conductivity type provided on a major surface of the semiconductor layer;

a second semiconductor pillar layer of a second conductivity type provided on the major surface of the semiconductor layer and adjoining the first semiconductor pillar layer;

a third semiconductor pillar layer of the first conductivity type provided on the major surface of the semiconductor layer and adjoining the second semiconductor pillar layer;

a forth semiconductor pillar layer of the second conductivity type provided on the major surface of the semiconductor layer and adjoining the third semiconductor pillar layer;

a fifth semiconductor pillar layer of the first conductivity type provided on the major surface of the semiconductor layer and adjoining the forth semiconductor pillar layer;

a first semiconductor base layer of the second conductivity type provided on the second semiconductor pillar layer;

a second semiconductor base layer of the second conductivity type provided on the forth semiconductor pillar layer;

a first semiconductor region of the first conductivity type selectively provided on a surface of the first semiconductor base layer;

a second semiconductor region of the first conductivity type selectively provided on a surface of the second semiconductor base layer;

a gate insulating film provided on the first semiconductor base layer between the first semiconductor region and the first semiconductor pillar layer and between the first semiconductor region and the third semiconductor pillar layer, and provided on the second semiconductor base layer between the second semiconductor region and the third semiconductor pillar layer and between the second semiconductor region and the fifth semiconductor pillar layer; and a gate electrode provided on the gate insulating film, each width of the first through fifth semiconductor pillar layers seen in a perpendicular direction to interfaces of p-n junctions formed among the first through fifth semiconductor pillar layers respectively being 10 microns or less.

According to another aspect of the invention, there is provided a semiconductor device comprising:

a semiconductor layer of a first conductivity type;

a first semiconductor pillar layer of the first conductivity type provided on a major surface of the semiconductor layer;

a second semiconductor pillar layer of a second conductivity type provided on the major surface of the semiconductor layer, adjoining and surrounding the first semiconductor pillar layer;

a third semiconductor pillar layer of the first conductivity type provided on the major surface of the semiconductor layer, adjoining and surrounding the second semiconductor pillar layer;

a semiconductor base layer of the second conductivity type provided on the second semiconductor pillar layer;

a semiconductor region of the first conductivity type selectively provided on a surface of the semiconductor base layer;

a gate insulating film provided on the semiconductor base layer between the semiconductor region and the first semiconductor pillar layer and between the semiconductor region and the third semiconductor pillar layer; and a gate electrode provided on the gate insulating film, each width of the first through third semiconductor pillar layers seen in a perpendicular direction to a interfaces of p-n junctions formed among the first through third semiconductor pillar layers respectively being 10 microns or less.

According to another aspect of the invention, there is provided a manufacturing method of a semiconductor device comprising:

forming a trench in a first semiconductor layer of a first conductivity type;

introducing impurities of the first conductivity type into side walls of the trench;

growing a second semiconductor layer of a second conductivity type epitaxially on the side walls and on the bottom of the trench;

introducing the impurities of the first conductivity type into the second semiconductor layer on the bottom of the trench;

growing epitaxially a third semiconductor layer of the first conductivity type on the side walls and on the bottom of the trench covered by the second semiconductor layer;

forming a base layer of the second conductivity type in an upper part of the second semiconductor layer;

forming a region of the first conductivity type on a surface of the base layer selectively;

forming a gate insulating film on the base layer; and forming a gate electrode on the gate insulating film.

According to another aspect of the invention, there is provided a manufacturing method of a semiconductor device comprising:

forming a trench in a first semiconductor layer of a first conductivity type;

forming an epitaxially grown second semiconductor layer of the first conductivity type on a side wall of the trench;

forming an epitaxially grown third semiconductor layer of a second conductivity type on the second semiconductor layer formed on the side wall of the trench;

forming an epitaxially grown fourth semiconductor layer of the first conductivity type on the third semiconductor layer formed on the side wall of the trench;

forming a base layer of the second conductivity type in an upper part of the third semiconductor layer;

forming a region of the first conductivity type on a surface of the base layer selectively;

forming a gate insulating film on the base layer; and forming a gate electrode on the gate insulating film.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

Figure 1A:
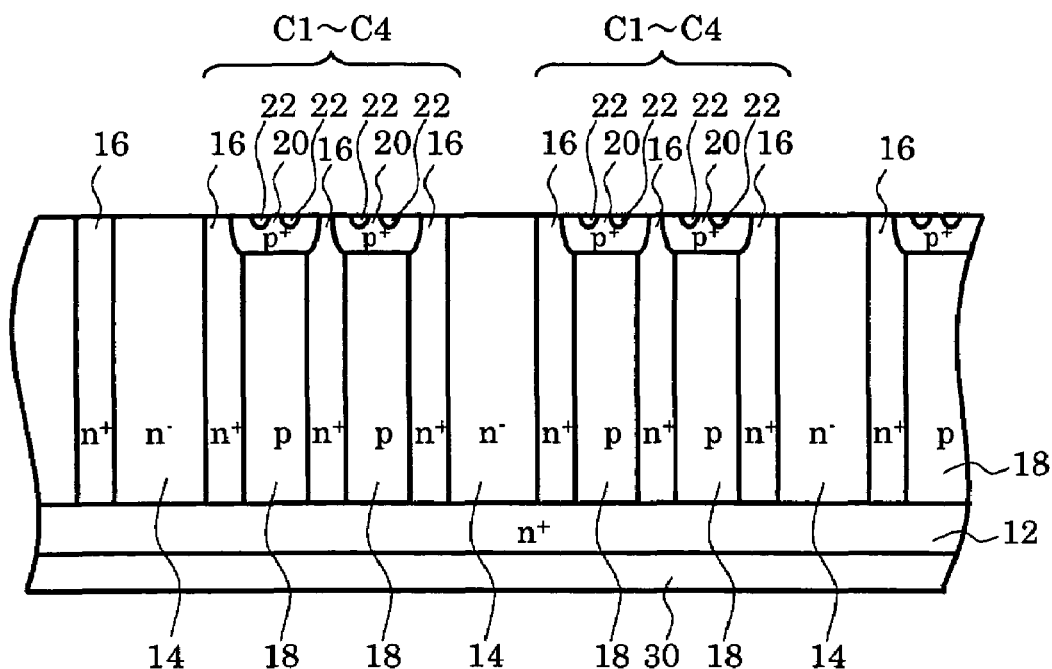
FIG. 1A is a schematic diagram illustrating the cross-sectional structure of the principal part of a first example of the semiconductor device according to the embodiment of the invention.

FIG. 1A is a schematic diagram illustrating the cross-sectional structure of the principal part of a first example of the semiconductor device according to the embodiment of the invention.

Figure 1B:
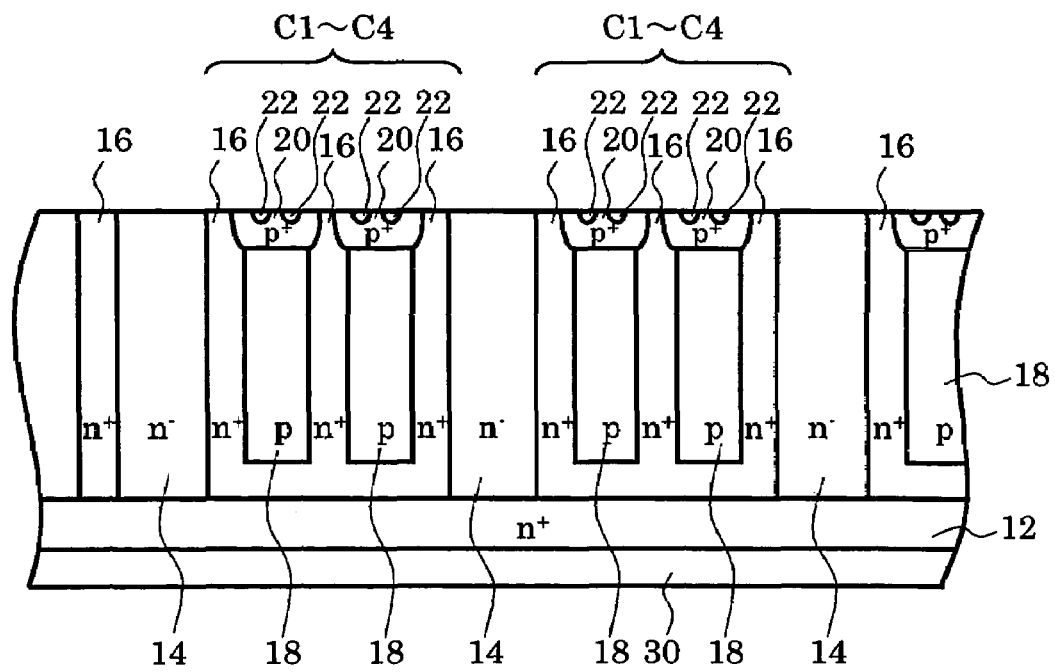
FIG. 1B is a schematic diagram illustrating the cross-sectional structure of the principal part of a second example of the semiconductor device according to the embodiment of the invention.

FIG. 1B is a schematic diagram illustrating the cross-sectional structure of the principal part of a second example of the semiconductor device according to the embodiment of the invention.

Figure 2:
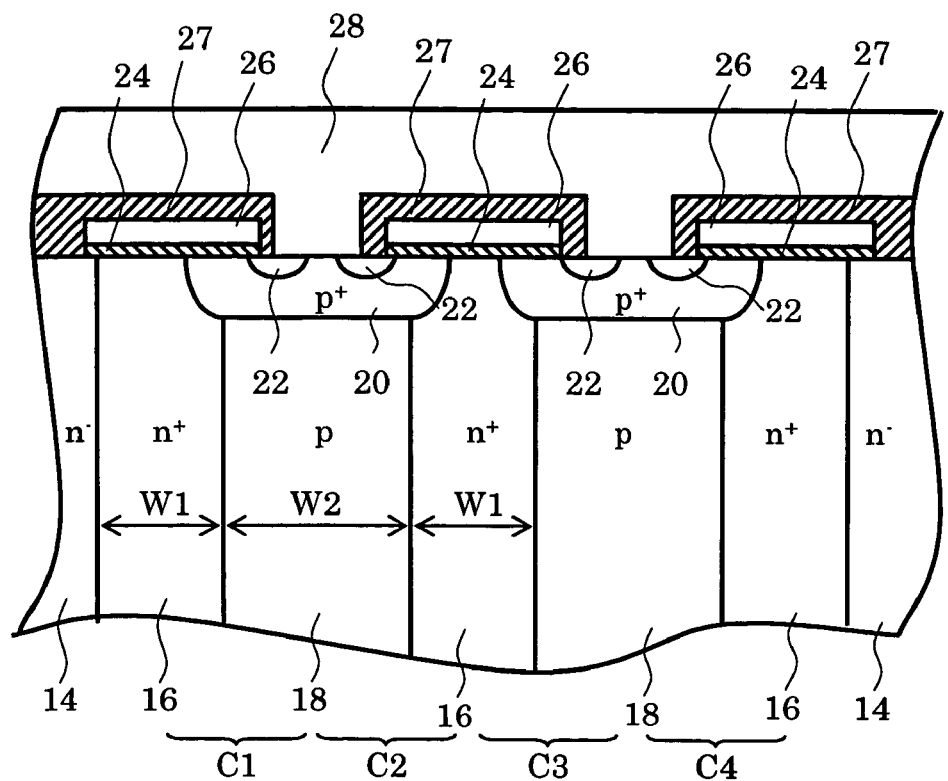
FIG. 2 is a schematic section view enlarging near electrodes.

FIG. 2 is a schematic section view enlarging near gate electrodes of these examples. In FIGS. 1A and 1B, the structure of an electrode on the gate electrodes side is omitted.

These examples expressed in FIGS. 1A through 2 show semiconductor devices of power metal-oxide semiconductor field effect transistor type, which have structures where an $n^+$-type pillar layers 16 and p-type pillar layers 18 are provided on an $n^+$-type substrate 12 substantially extending in a direction perpendicular to the $n^+$-type substrate 12. These pillar layers are appropriately separated by $n^-$-type intermediate layers 14.

The p-type pillar layers 18 may be provided so that they touch the substrate 12 as shown in FIG. 1A. Alternatively, the p-type pillar layers 18 may be provided so that they are remote from the substrate 12 as shown in FIG. 1B.

A $p^+$-type base region 20 is formed on the p-type pillar layer 18, and a pair of $n^+$-type source regions 22 are formed on the surface thereof. As expressed in FIG. 2, the gate electrodes 26 insulated by an insulating layers 24 are formed on the $p^+$-type base regions 20.

The gate electrodes 26 are formed to straddle the $n^+$-type pillar layers 16. A source electrode 28 is connected to the source regions 22 and to the $p^+$-type base regions 20. On the other hand, as expressed in FIGS. 1A and 1B, a drain electrode 30 is formed on the back of the $n^+$-type substrate 12.

If predetermined gate voltage is applied to the gate electrodes 26, channels will be formed near the surface of the $p^+$-type base regions 20 provided directly under the gate electrodes 26. And the $n^+$-type source regions 22 and the n-type pillar layers 16 which are adjacent to the $n^+$-type source regions 22 will be connected electrically. And it will be in ON state between the source electrode 28 and the drain electrode 30. That is, a current path of each MOSFET is formed in each $n^+$-type pillar layer 16. ON resistance ($R_{on}$) can be lowered by making concentrations of the impurities of the $n^+$-type pillar layers 16 high. As expressed in FIG. 2, the unit of the element corresponding to the current path is called a "cell."

In this example, four cells C1 through C4 are formed adjoining. A plurality of groups consisted of these four cells C1 through C4 is provided separated by the $n^-$-type intermediate layers 14. Thus, by forming four cells C1 through C4 adjacently, the formation density of cells can be raised sharply, and ON resistance ($R_{on}$) can be reduced.

Furthermore, according to the embodiment of the invention, it becomes possible to make the width W1 of the $n^+$-type pillar layer 16 and the width W2 of the p-type pillar layer 18 much narrower than before, as explained in full detail later. Specifically, it has been difficult to make the widths of the pillars narrow to 10 microns or less, by the conventional method of forming pillar structure by accumulating the pillar structures little by little by repeating ion implantation and epitaxial growth, and performing prolonged activation processing at high temperature finally, as mentioned above.

On the contrary to this, in this embodiment, the pillar layers 16 and 18 can be formed by epitaxial growth. As the result, it becomes very easy to reduce those widths W1 and W2 to 10 microns or less. Furthermore, it is also possible to reduce these widths W1 and W2 to 1 micron or less. That is, it becomes possible to form the $n^+$-type pillar layers 16 that act as the current paths with much higher density than before. Consequently, it becomes possible to raise the channel density and to lower ON resistance ($R_{on}$) remarkably.

Moreover, by providing the $n^-$-type intermediate layers 14 at the end of the elements to be terminated, the concentrations of the intermediate layers 14 can be lowered and the breakdown voltage of the elements can be raised, regardless of the concentrations of impurities of the cells. That is, according to this embodiment, it can be attained to reduce the ON resistance ($R_{on}$) further and to maintain the breakdown voltages, compared with the conventional structure.

Figure 3:
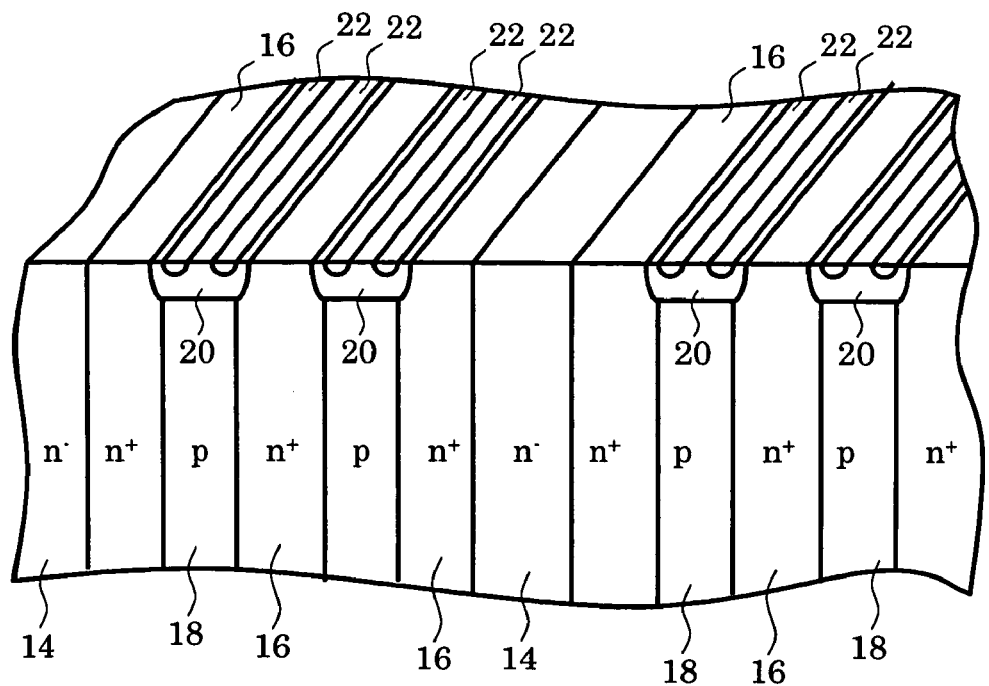
FIG. 3 is a partial cross-sectional perspective diagram showing an example of the plane pattern of the semiconductor device of the embodiment of the invention.

FIG. 3 is a schematic diagram showing an example of the plane pattern of the semiconductor device of this embodiment. That is, this figure is a partial cross-sectional perspective diagram of the semiconductor device whose electrodes on the gate side are removed. The same symbols are given to the same elements as what were mentioned above with references to FIG. 1A through FIG. 2 about this figure, and detailed explanation will be omitted.

In the case of this example, the n-type pillar layers 16 and the p-type pillar layers 18 have a plane pattern of a substantially stripe fashion. And the $n^+$-type source regions 22 are also formed in the substantially stripe fashion corresponding to this stripe pattern. The gate electrodes and source electrodes which are not illustrated are appropriately formed corresponding to this stripe pattern. Thus, by forming each pillar layer 16 and each pillar layer 18 in a stripe fashion, it becomes easy to make the channel density very high.

Figure 4:
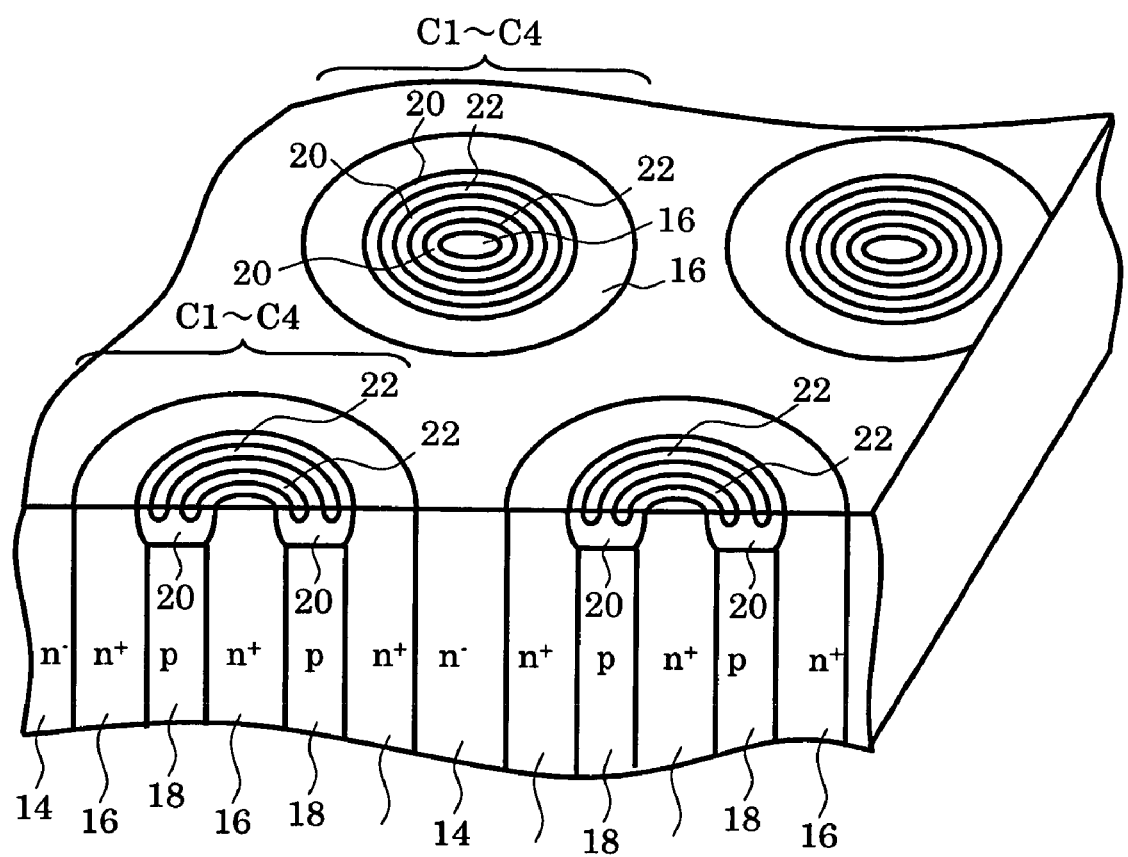
FIG. 4 is a partial cross-sectional perspective diagram showing another example of the plane pattern of the semiconductor device of the embodiment of the invention.

FIG. 4 is a schematic diagram showing another example of the plane pattern of the semiconductor device of this embodiment. That is, this figure is also a partial cross-sectional perspective diagram of the semiconductor device whose electrodes by the side of the gate are removed. The same symbols are given to the same elements as what were mentioned above with references to FIG. 1A through FIG. 3 about this figure, and detailed explanation will be omitted.

In the case of this example, the groups consisted of the $n^+$-type pillar layers 16 and the p-type pillar layers 18 separated by the $n^-$-type intermediate layers 14 are formed in the substantially concentric circle fashion. That is, the n-type pillar layer 16 is provided at a center, and the p-type pillar layer 18 and the $n^+$-type pillar layer 16 are provided outside the n-type pillar layer 16 provided at the center in this order in the concentric circle fashion.

Thus, when seen the plan view, the groups of the cells C1 through C4 formed in a concentric circle fashion may be arranged in a tetragonal-lattice fashion (mesh fashion), and may also be arranged in various kinds of patterns, such as a staggered fashion (offset mesh fashion) or a hexagonal lattice fashion. In such pattern arrangement of a concentric circle fashion, it becomes possible to raise the channel density effectively depending on the form and the size of the elements. The structure expressed in FIG. 4 is only one example. For example, various kinds of structures where the pillar layers 16 and 18 are arranged by turns in a concentric loop fashion such as concentric ellipse fashion and concentric flat circle fashion, instead of concentric circle fashion are also included by the range of the invention.

Figure 5:
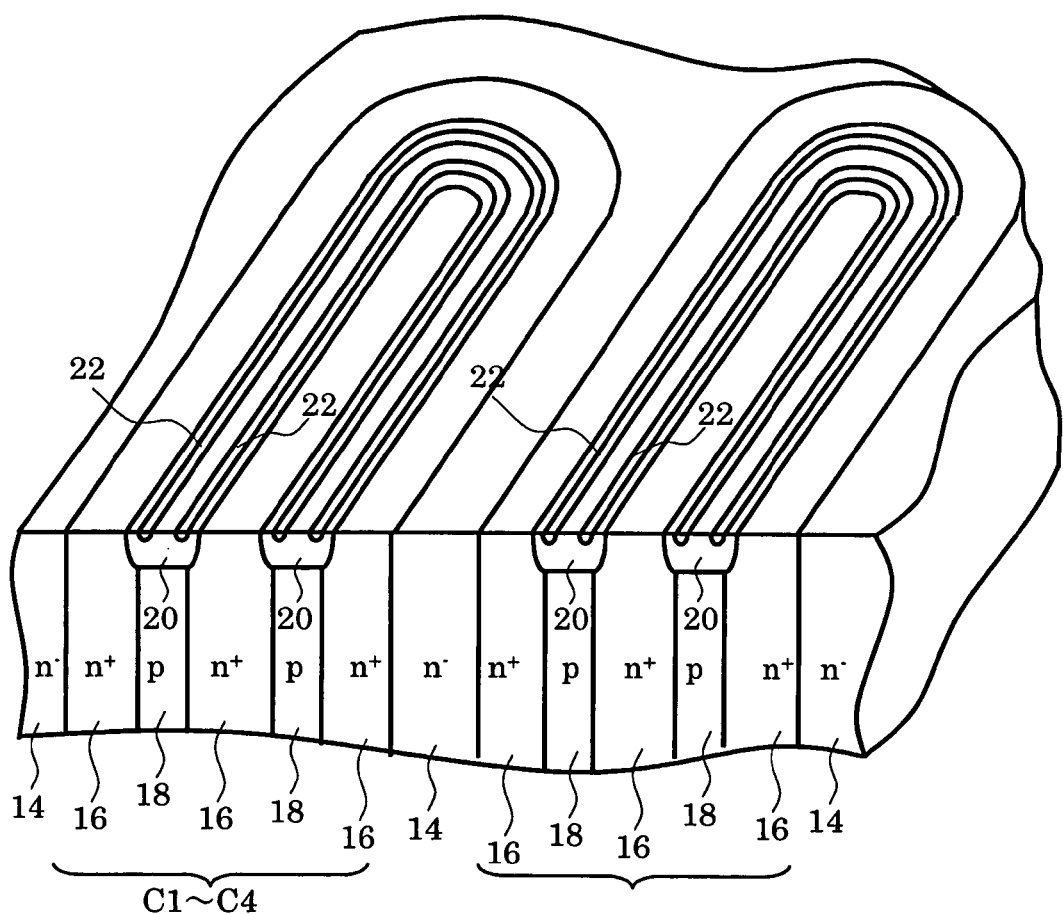
FIG. 5 is a partial cross-sectional perspective diagram illustrating another example in which the pillar layers are arranged in a concentric loop fashion.

FIG. 5 is a partial cross-sectional perspective diagram illustrating another example in which the pillar layers 16 and 18 are arranged in a concentric loop fashion. That is, the p-type pillar layers 18 and the $n^+$-type pillar layers 16 are arranged in a concentric loop fashion outside the n-type pillar layers 16 extending in one direction. Also in such structure, the cells C1 through C4 can be formed at high density and the effect of the reduction of ON resistance can be acquired.

Next, the manufacturing method of the semiconductor device of this embodiment will be explained. FIG. 6 through FIG. 13 are process section views showing the principal parts of the first manufacturing method of the semiconductor device of this embodiment.

Figure 6:
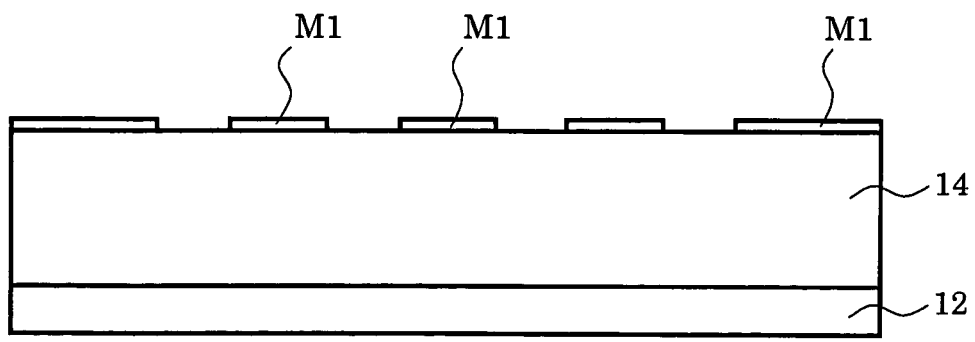
FIG. 6 is a process section view showing the principal part of the first manufacturing method of the semiconductor device of the embodiment of the invention.

First, as expressed in FIG. 6, the $n^-$-type semiconductor layer 14 (impurities (As) concentration: $1 \times 10^{15}$ cm$^{-3}$) is grown up to the thickness of about 50 micrometers by epitaxial growth on the surface of the $n^+$-type semiconductor substrate 12 (impurities concentration: $1 \times 10^{18}$ cm$^{-3}$). Furthermore, for example, a mask M1 is formed by forming a silicon-oxide film as a mask for trench etching and etching selectively the portion to be trench-etched (width: about 18 micrometers).

Figure 7:
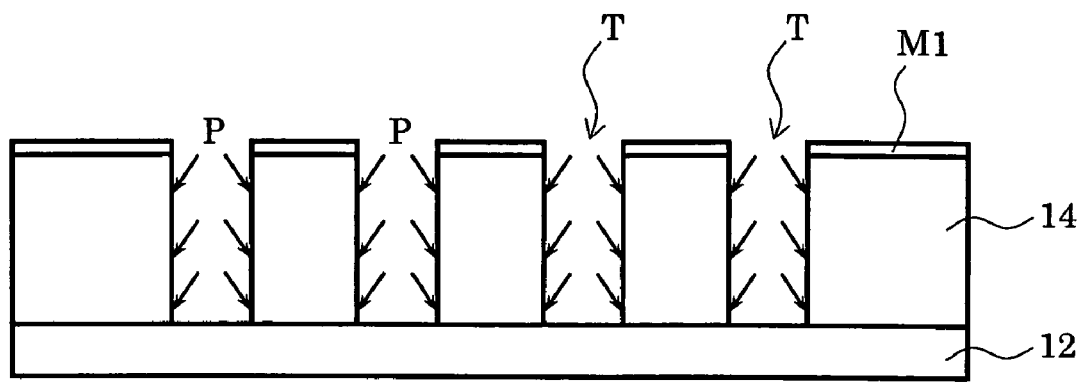
FIG. 7 is a process section view showing the principal part of the first manufacturing method of the semiconductor device of the embodiment of the invention.

Next, as expressed in FIG. 7, trenches T are formed by carrying out etching by the same depth as the thickness of the epitaxial-growth layer 14. Furthermore, the ion for forming $n^+$-type semiconductor only on the side walls and the bottoms of the trenches T is implanted by slanting ion implantation. The ion can be implanted under the conditions, for example, that P (phosphorus) is used as the ion kind and a dose amount is $1 \times 10^{13}$ cm$^{-2}$. However, neither an ion kind nor a dose amount is limited to this condition, for example, various kinds of elements including As (arsenic) can be used. About this point, it is the same also about all other ion implantation.

Figure 8:
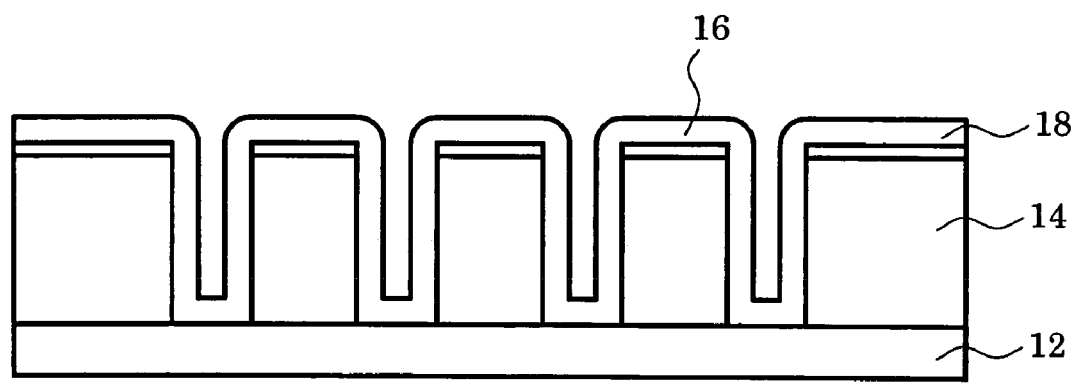
FIG. 8 is a process section view showing the principal part of the first manufacturing method of the semiconductor device of the embodiment of the invention.

Next, as expressed in FIG. 8, the p-type semiconductor layer 18 (impurities (B) concentration: $2 \times 10^{15}$ cm$^{-3}$, 6 micrometers of thickness) is grown up by epitaxial growth. In this case, the selective growing method can be used for the method of growing epitaxially or the non-selective growing method can also be used for it.

Figure 9:
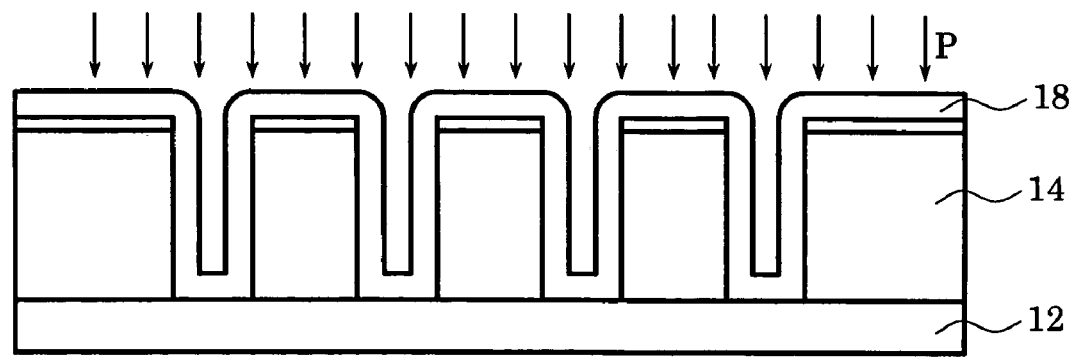
FIG. 9 is a process section view showing the principal part of the first manufacturing method of the semiconductor device of the embodiment of the invention.

Next, as expressed in FIG. 9, the ion for forming the $n^+$-type semiconductor only at the bottom of the trenches is implanted in by ion implantation. As for the ion implantation in this case, it is desirable to adopt the perpendicular ion implantation by which the ion is incidenced in a substantially perpendicular direction to a substrate major surface. The ion can be implanted under the conditions, for example, that P (phosphorus) is used as the ion kind and a dose amount is $1 \times 10^{13}$ cm$^{-2}$.

Figure 10:
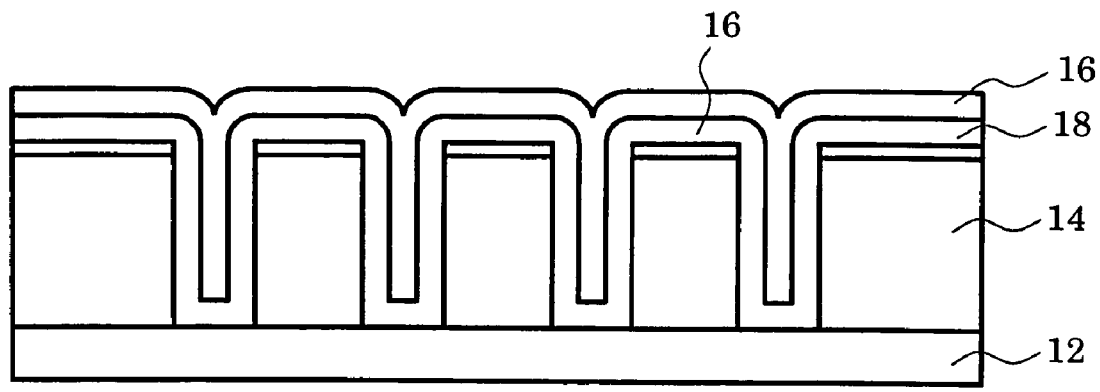
FIG. 10 is a process section view showing the principal part of the first manufacturing method of the semiconductor device of the embodiment of the invention.
Figure 11:
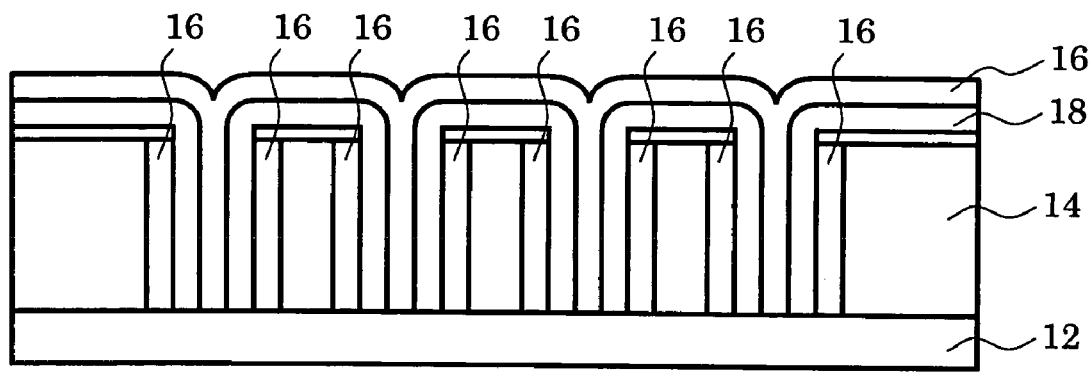
FIG. 11 is a process section view showing the principal part of the first manufacturing method of the semiconductor device of the embodiment of the invention.

Next, as expressed in FIG. 10, the $n^+$-type semiconductor layer 16 (impurities (As) concentration: $2 \times 10^{15}$ cm$^{-3}$, thickness: 6 micrometers) is formed by epitaxial growth so that the insides of the trenches may be embedded. Then, diffusion and activation of the poured-in dopant are carried out on the side walls of the trenches into which ion was implanted (FIG. 7) and at the bottom of the embedded layer (FIG. 9), by performing thermal diffusion processing. Consequently, as expressed in FIG. 11, the n-type pillar layer 16 is formed on sides of the trenches. Moreover, $n^+$-type semiconductor region is formed also at the bottom of the $p^+$-type semiconductor layers 18, and the substrate 12 and upper $n^+$-type semiconductor layer 16 contact.

Figure 12:
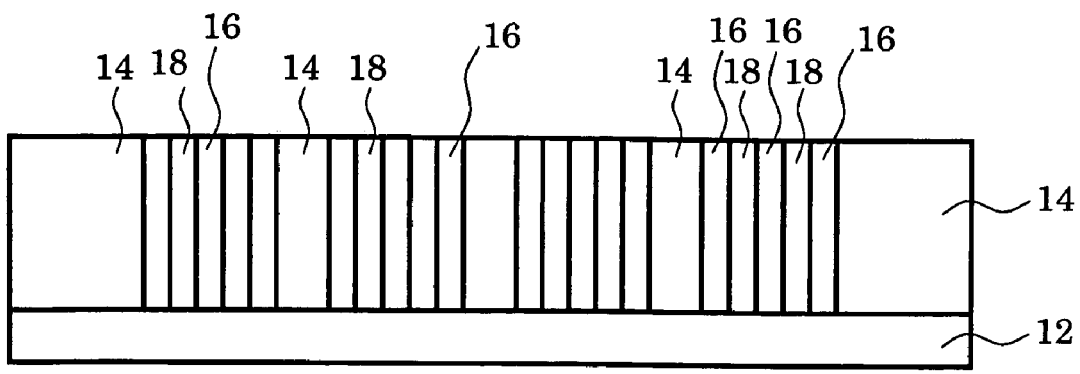
FIG. 12 is a process section view showing the principal part of the first manufacturing method of the semiconductor device of the embodiment of the invention.
Figure 13:
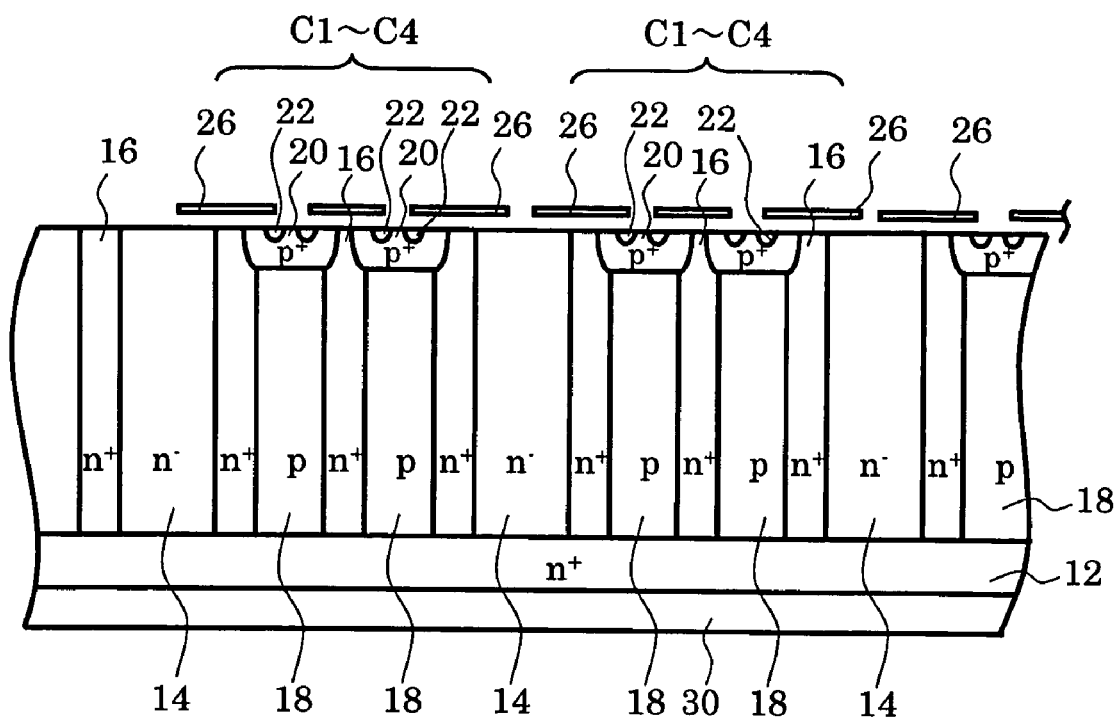
FIG. 13 is a process section view showing the principal part of the first manufacturing method of the semiconductor device of the embodiment of the invention.

Next, as expressed in FIG. 12, the surface is polished with CMP (chemical mechanical polishing) technology, and a side of semiconductor crystal is exposed. Then, as expressed in FIG. 13, the $p^+$-type base layer 20 is formed on the surface of the p-type pillar layer 18 like the conventional power MOSET (metal-oxide semiconductor field effect transistor) And the $n^+$-type source regions 22 are further formed on the surface of the $p^+$-type base layer 20 selectively. And the gate insulating films 24 and the gate electrodes 26 are formed so that the source regions 22 and the $n^+$-type pillar layers 16 may be straddled. Furthermore, the source electrode 28 is formed after forming the insulating interlayer films, and, on the other hand, the drain electrode 30 is formed on the back side of the substrate 12. Thus, the principal part of the semiconductor device of this embodiment is completed.

As explained above, according to the manufacturing method of this embodiment, it becomes possible to form the $n^+$-type pillar layers 16 with high-concentration and the p-type pillar layers 18 with high density. Especially, since the p-type pillar layers 18 and the $n^+$-type pillar layers 16 formed among these p-type pillar layers 18 are grown epitaxially, it becomes possible to make their width (W' and W2 in FIG. 2) very small. As the result, the formation density of the cells can be raised and ON resistance can be reduced. Moreover, in the terminus portions, it is possible to make the concentration of the intermediate layers 14 low regardless of the concentration of the semiconductor layers of the cells. Therefore, it is easy to raise a breakdown voltage.

Next, the second manufacturing method of this embodiment will be explained.

FIG. 14 through FIG. 20 are process section views showing the principal part of the second manufacturing method of this embodiment.

Figure 14:
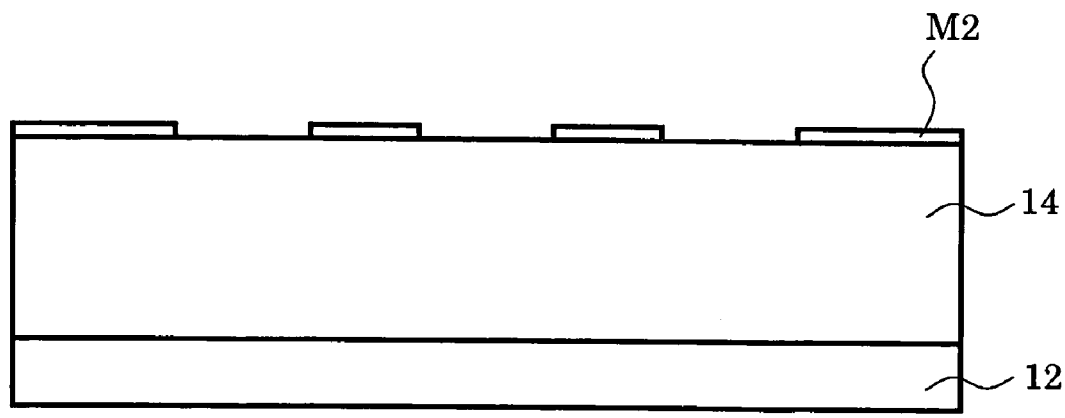
FIG. 14 is a process section view showing the principal part of the second manufacturing method of the semiconductor device of the embodiment of the invention.

First, as expressed in FIG. 14, the $n^-$-type semiconductor layer 14 (impurities (As) concentration: $1 \times 10^{15}$ cm$^{-3}$) is grown up to the thickness of about 50 micrometers by epitaxial growth on the surface of the $n^+$-type semiconductor substrate 12 (impurities concentration: $1 \times 10^{18}$ cm$^{-3}$). And a mask M2 is formed by forming, for example, a silicon-oxide film as mask material for trench etching, and etching selectively the portion (width: about 30 micrometers) to be trench-etched.

Figure 15:
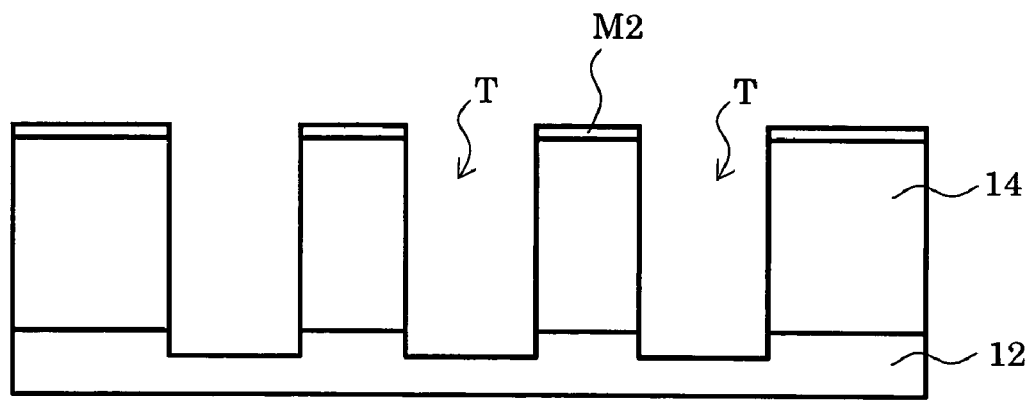
FIG. 15 is a process section view showing the principal part of the second manufacturing method of the semiconductor device of the embodiment of the invention.

Next, as expressed in FIG. 15, the trenches T is formed by etching the semiconductor layer 14 exposed to the opening of the mask M2. In this step, in order to form the structure shown in FIG. 1A, the trenches may be over-etched to a level which is deeper than the epitaxial-growth layer 14, for example, for about six micro micrometers as shown in FIG. 15. The amount of over-etching is equivalent to the thickness of the $n^+$-type semiconductor layers 16 formed at next process as explained in full detail later. Therefore, if the $n^+$-type semiconductor layers 16 are grown up to the thickness of about 1 micrometer, the amount of over-etching in the process expressed in FIG. 15 will also be set to about 1 micrometer corresponding to the $n^+$-type semiconductor layers 16.

Alternatively, the trenches T may need not to be over-etched in the case where the structure shown in FIG. 1B is formed. That is, by forming the trenches T whose depth is substantially the same as the thickness of the epitaxial-growth layer 14, the structure shown in FIG. 1G may be formed.

Figure 16:
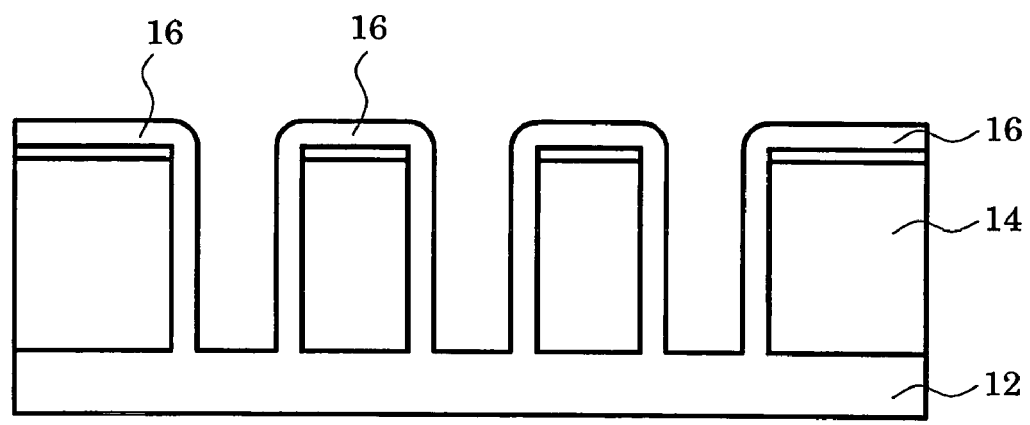
FIG. 16 is a process section view showing the principal part of the second manufacturing method of the semiconductor device of the embodiment of the invention.

Next, as expressed in FIG. 16, the $n^+$-type semiconductor layers 16 (impurities (As) concentration: $2 \times 10^{15}$ cm$^{-3}$, 6 micrometers of thickness) is formed by epitaxial growth. As the above-mentioned, the thickness of the n+-type semiconductor layers 16 can be made still thinner. By making the semiconductor layers 16 thinner, the n+-type pillar layers 16 can be formed with higher density. This point will be explained in full detail later.

Figure 17:
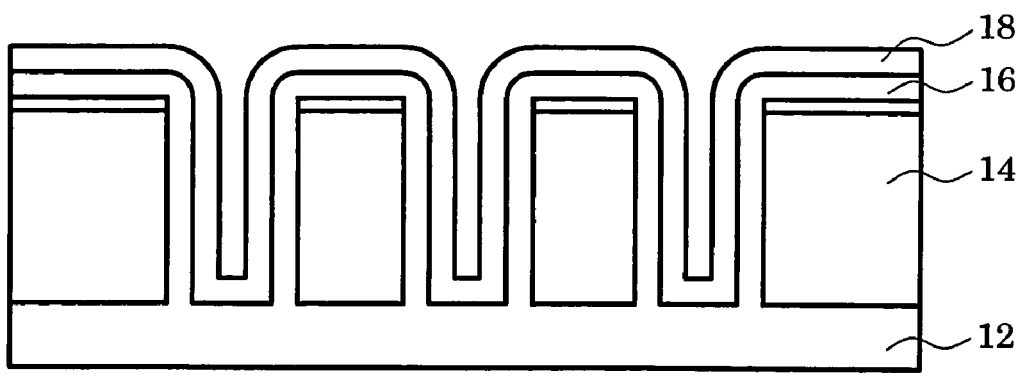
FIG. 17 is a process section view showing the principal part of the second manufacturing method of the semiconductor device of the embodiment of the invention.

Next, as expressed in FIG. 17, the p-type semiconductor layer 18 (impurities (B) concentration: $2 \times 10^{15}$ cm$^{-3}$, 6 micrometers of thickness) is grown up. In this case, the selective epitaxial growing method is sufficient as the method of growing epitaxially, or the non-selective epitaxial growing method is also sufficient as it. Also in this process, if the thickness of the semiconductor layer 18 is made thinner, the channels can be formed with higher density, as explained in full detail later.

Figure 18:
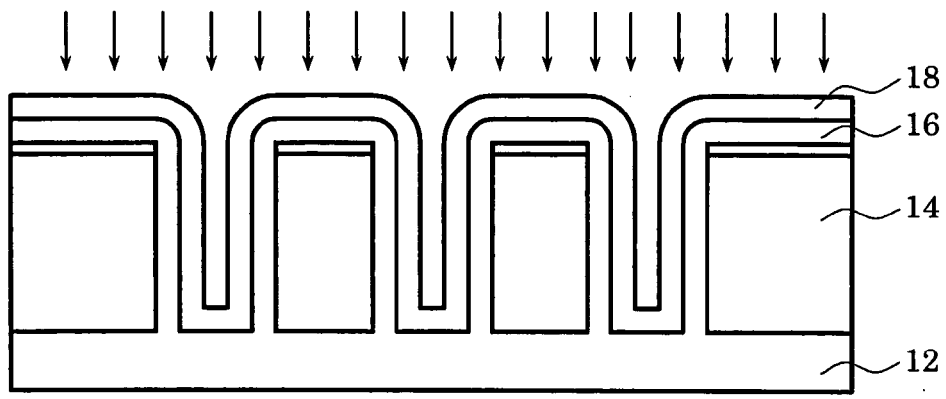
FIG. 18 is a process section view showing the principal part of the second manufacturing method of the semiconductor device of the embodiment of the invention.

Next, as expressed in FIG. 18, ion implantation is performed in a substantially perpendicular direction to a major surface of the substrate 12. Thus, the ion for making the n+-type semiconductor only at the bottom of the trenches is implanted. The ion can be implanted under the conditions, for example, that P (phosphorus) is used as the ion kind and a dose amount is $1 \times 10^{13}$ cm$^{-2}$.

Figure 19:
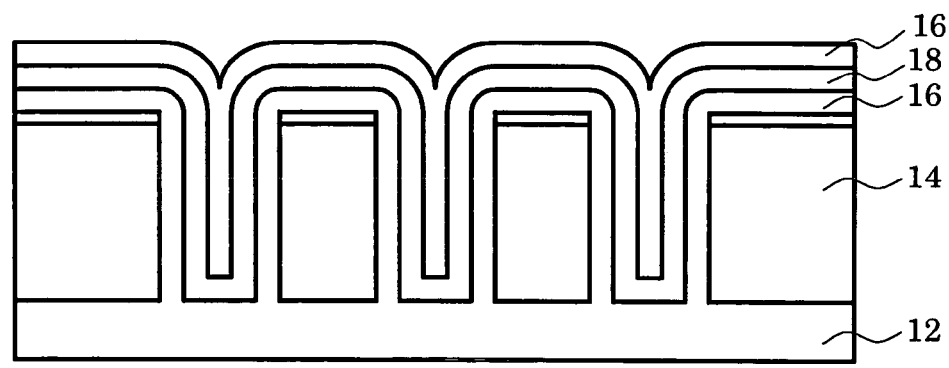
FIG. 19 is a process section view showing the principal part of the second manufacturing method of the semiconductor device of the embodiment of the invention.

Next, as expressed in FIG. 19, the n+-type semiconductor layer 16 (impurities (As) concentration: $2 \times 10^{15}$ cm$^{-3}$, 6 micrometers of thickness) is formed by epitaxial growth so that the inside of the trenches may be embedded. Then, the n-type impurities implanted into the bottom of the p-type semiconductor layer 18 are diffused and activated by performing thermal diffusion processing. Consequently, the bottom of the p-type semiconductor layer 18 is made to reverse to the n+-type semiconductor region, and the n+-type semiconductor substrate 12 and the n+-type semiconductor layer 16 on the n+-type semiconductor substrate 12 are formed so that they contact.

Figure 20:
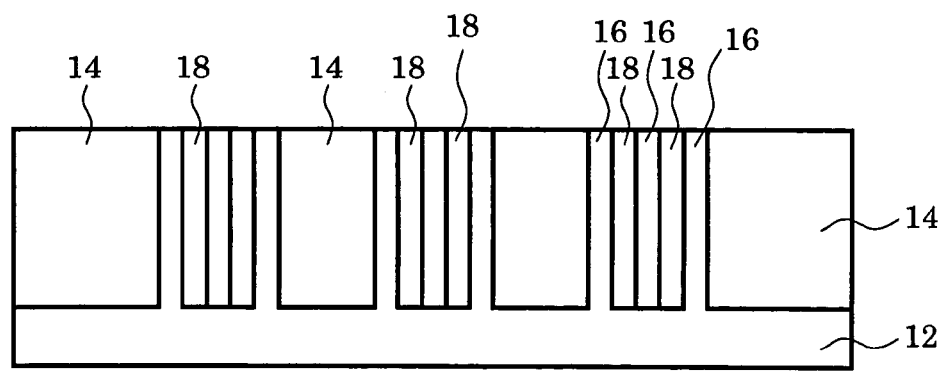
FIG. 20 is a process section view showing the principal part of the second manufacturing method of the semiconductor device of the embodiment of the invention.

Then, as expressed in FIG. 20, etch back is performed until the semiconductor crystal face is exposed to the surface by CMP technology. Then, the p+-type base layers 20 are formed on the surface of the p-type pillar layers 18 like the conventional power metal-oxide semiconductor field effect transistor. And the n+-type source regions 22 are formed on the surface selectively. And the gate insulating films 24 and the gate electrodes 26 are formed so that the source regions 22 and the n+-type pillar layers 16 may be straddled. Furthermore, the source electrode 28 is formed after forming the insulating interlayer films. On the other hand, the drain electrode 30 is formed on the back side of the substrate 12. Thus, the principal part of the semiconductor device of this embodiment is completed.

As explained above, the manufacturing method of this embodiment also enables to form the n+-type pillar layers 16 of high-concentration and the p-type pillar layers 18 with high density. In particular, in the case of this example, the n+-type pillar layers 16 and the p-type pillar layers 18 are formed by epitaxial growth, respectively. As the result, it becomes easy to form those widths (width W1 and W2 in FIG. 2) in 10 microns or less. Furthermore, it also becomes possible to form in 1 micron or less. As the result, it becomes possible to raise the accumulation density of the cells sharply and to reduce ON resistance remarkably. Moreover, in the terminus part, since it is possible to reduce the concentrations of the intermediate layers 14 regardless of the concentrations of the semiconductor layer of the cells, the breakdown voltage is easy to be raised.

Next, the third manufacturing method of this embodiment will be explained.

FIG. 21 through FIG. 28 are process section views showing the principal part of the third manufacturing method of this embodiment.

Figure 21:
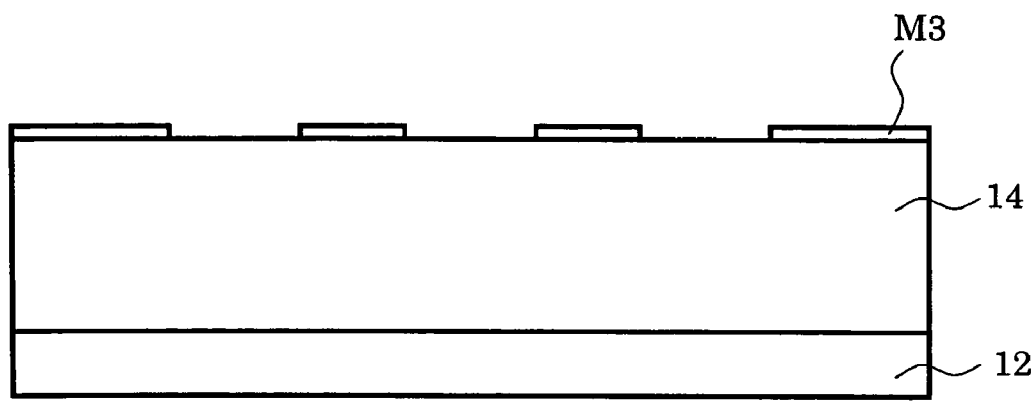
FIG. 21 is a process section view showing the principal part of the third manufacturing method of the semiconductor device of the embodiment of the invention.

First, as first expressed in FIG. 21, n−-type semiconductor layer 14 (impurities (As) concentration: $1 \times 10^{15}$ cm$^{-3}$) is grown up to the thickness of about 50 micrometers by epitaxial growth on the surface of the n+-type semiconductor substrate 12 (impurities concentration: $1 \times 10^{18}$ cm$^{-3}$). And, for example, a silicon-oxide film is formed as mask material for trench etching, and a mask M3 is formed by etching selectively the portions (width: about 30 micrometers) to be trench-etched.

Figure 22:
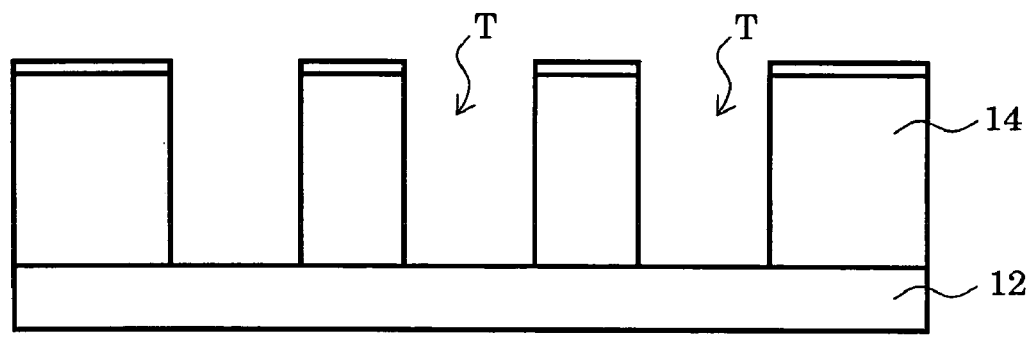
FIG. 22 is a process section view showing the principal part of the third manufacturing method of the semiconductor device of the embodiment of the invention.

Next, as expressed in FIG. 22, the trenches T are formed by etching the semiconductor layer 14 exposed to the opening of the mask M3. In this case, the trenches T are formed to a level which is as deep as the epitaxial-growth layer 14.

Figure 23:
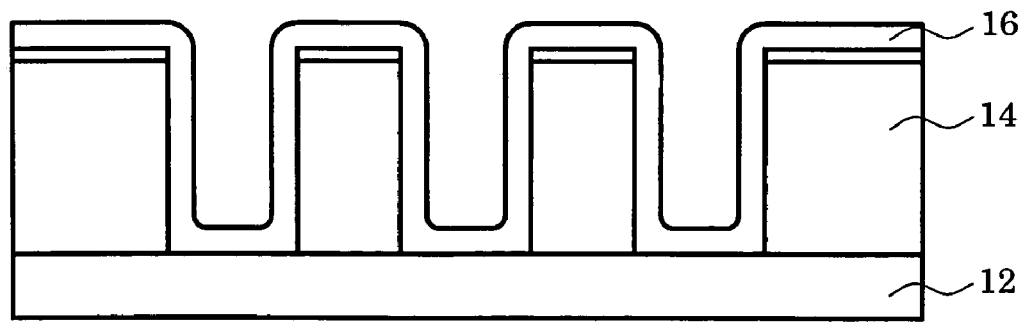
FIG. 23 is a process section view showing the principal part of the third manufacturing method of the semiconductor device of the embodiment of the invention.

Next, as expressed in FIG. 23, the n+-type semiconductor layer 16 (impurities (As) concentration: $2 \times 10^{15}$ cm$^{-3}$, 6 micrometers of thickness) is formed by epitaxial growth.

Figure 24:
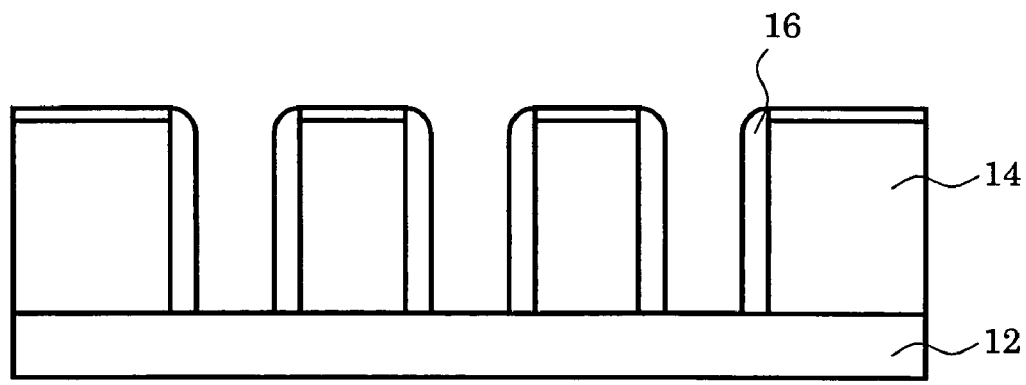
FIG. 24 is a process section view showing the principal part of the third manufacturing method of the semiconductor device of the embodiment of the invention.

Next, as expressed in FIG. 24, the n+-type semiconductor layer 16 formed at the bottom of the trenches T and the n+-type semiconductor layer 16 of the polycrystalline fashion formed on the mask M3 are etched by an anisotropic etching method. And the n+-type semiconductor substrate 12 is exposed to the bottom of the trenches.

Figure 25:
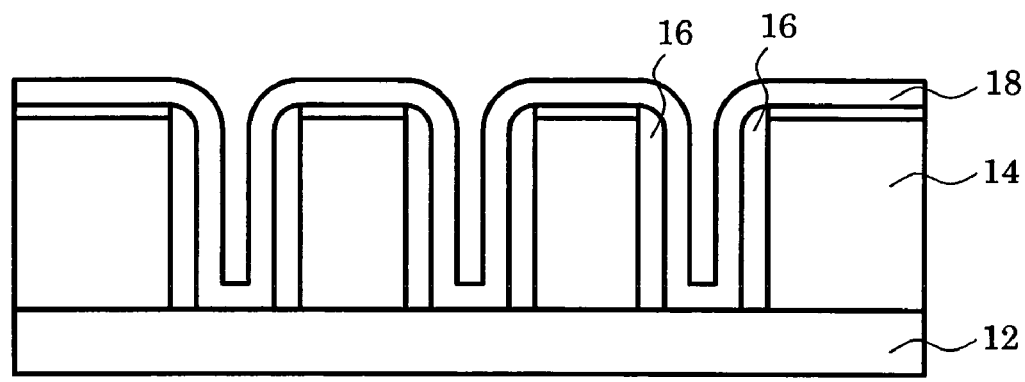
FIG. 25 is a process section view showing the principal part of the third manufacturing method of the semiconductor device of the embodiment of the invention.

Next, as expressed in FIG. 25, the p-type semiconductor layer 18 (impurities (B) concentration: $2 \times 10^{15}$ cm$^{-3}$, 6 micrometers of thickness) is grown up. The selective epitaxial growing method or the non-selective epitaxial growing method can be used as the epitaxial growing method in this process.

Figure 26:
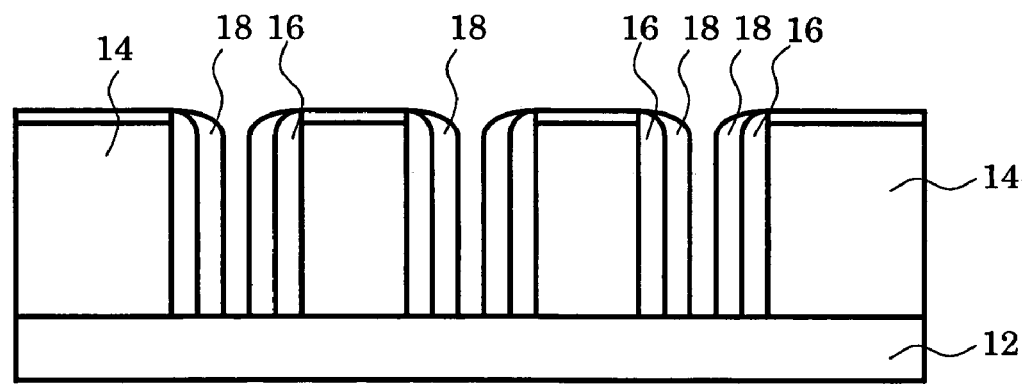
FIG. 26 is a process section view showing the principal part of the third manufacturing method of the semiconductor device of the embodiment of the invention.

And by carrying out anisotropic etching like the process mentioned above about FIG. 24, as expressed in FIG. 26, the n+-type substrate 12 is exposed to the bottom of the trenches.

Figure 27:
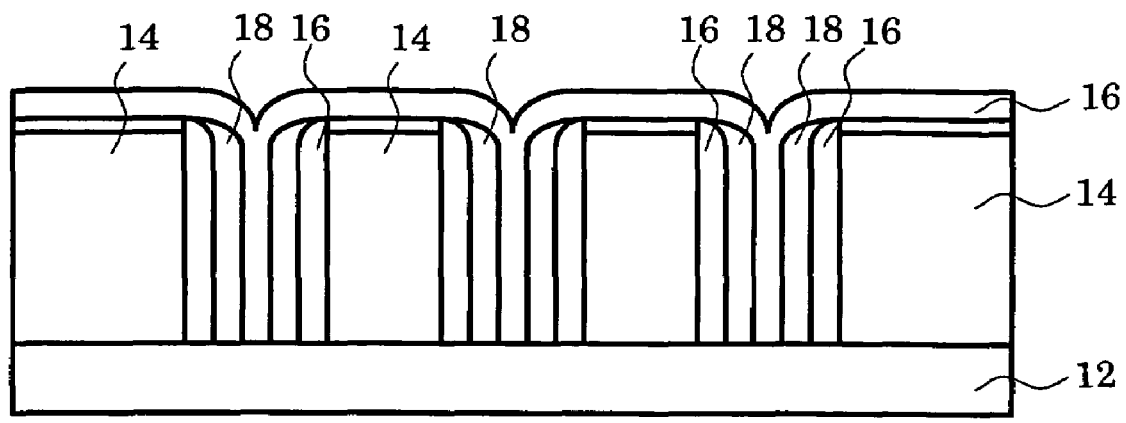
FIG. 27 is a process section view showing the principal part of the third manufacturing method of the semiconductor device of the embodiment of the invention.
Figure 28:
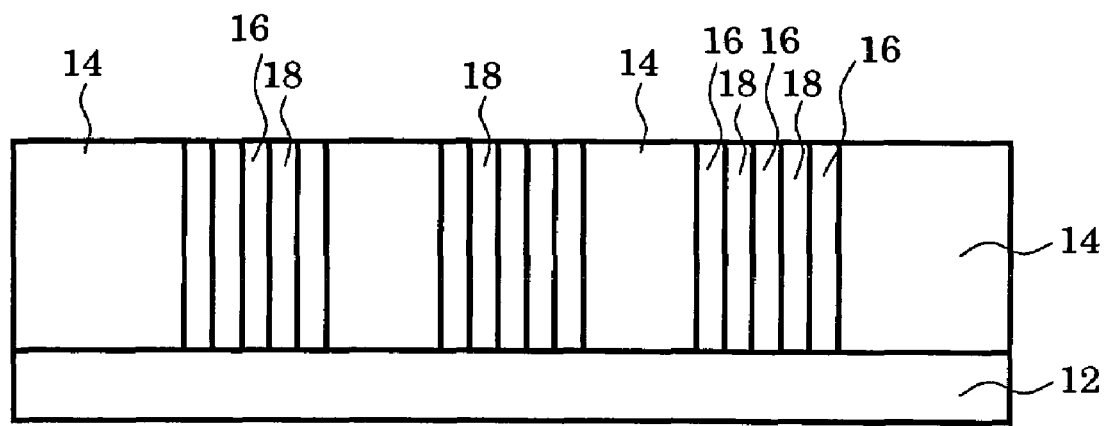
FIG. 28 is a process section view showing the principal part of the third manufacturing method of the semiconductor device of the embodiment of the invention.

Then, as expressed in FIG. 27, the n+-type semiconductor layer 16 (impurities (As) concentration: $2 \times 10^{15}$ cm$^{-3}$, 6 micrometers of thickness) is formed by epitaxial growth so that the inside of the trenches may be embedded. Then, the structure expressed in FIG. 28 is acquired by performing etch back until the semiconductor crystal face is exposed by CMP technology.

Then, like the conventional power metal-oxide semiconductor field effect transistor, the p+-type base layers 20 are formed on the surface of the p-type pillar layers 18, and the n+-type source regions 22 are further formed on the surface of the p+-type base layers 20 selectively. And the gate insulating films 24 and the gate electrodes 26 are formed so that the source regions 22 and the n+-type pillar layers 16 may be straddled. Furthermore, the principal part of the semiconductor device of this embodiment is completed by forming the source electrode 28 after forming the insulating interlayer film and on the other hand forming the drain electrode 30 on the back side of the substrate 12.

As explained above, the manufacturing method of this embodiment also enables to form high-concentration n+-type pillar layers 16 and the p-type pillar layers 18 with high density. In particular, also in this example, the n+-type pillar layers 16 and the p-type pillar layers 18 are formed by epitaxial growth, respectively. As the result, it becomes easy to form those widths (width W1 and W2 in FIG. 2) in 10 microns or less, and it also becomes possible to form them 1 microns or less. Namely, the thickness of each semiconductor layer grown epitaxially expressed in FIG. 23, FIG. 25, and FIG. 27 should be made into 10 microns or less, or 1 micron or less further.

As the result, it becomes possible to raise the accumulation densities of the cells sharply and also to reduce ON resistance remarkably. Moreover, since it is possible to make the concentrations of the intermediate layers 14 low regardless of the concentrations of the semiconductor layers of the cells, it is easy to make the breakdown voltage of the terminus part high. Moreover, in the manufacturing method of this example, an ion implantation process and a thermal diffusion process which accompanies the ion implantation process can be skipped.

Figure 29:
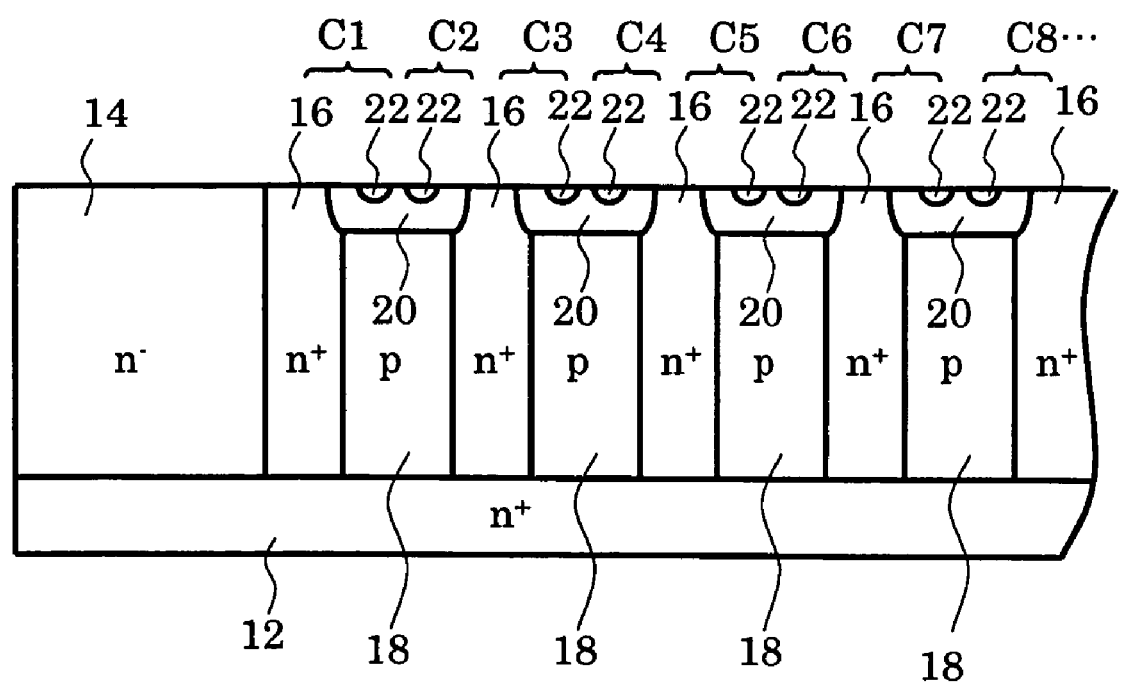
FIG. 29 is a schematic diagram showing the section of the semiconductor device according to the another example of the embodiment of the invention.

Next, another example of the semiconductor device of the embodiment of the invention will be explained. FIG. 29 is a schematic diagram showing the section of the semiconductor device according to this example.

That is, this figure expresses near the terminus part of the power metal-oxide semiconductor field effect transistor. The electrodes and insulating films, such as a gate electrode, are omitted for convenience.

In this example, the $n^-$-type intermediate layer 14 of low concentration is provided in the terminus part of the semiconductor device, and the $n^+$-type pillar layers 16 and the p-type pillar layers 18 are arranged by turns inside the semiconductor device. And the cells C1 and C2 and . . . are continuously formed corresponding to these pillar layers. Then, as compared with the semiconductor devices expressed in FIG. 1A through FIG. 5, the cells can be formed with higher density. That is, ON resistance ($R_{on}$) can be reduced further. Simultaneously, a breakdown voltage is also securable by providing the $n^-$-type intermediate layer 14 of low-concentration in the terminus part.

Such arrangement of the cells with super high-density is realizable, for example with the third manufacturing method mentioned above. FIGS. 30A through 31D are process section views which illustrate a part of manufacturing method of the semiconductor device of this example. That is, these figures express the examples adapting the third manufacturing method mentioned above near the terminus part of the semiconductor device.

Figure 30A:
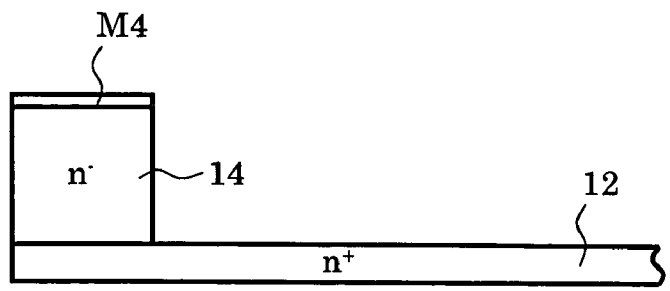
FIGS. 30A through 30E are process section views which illustrate parts of manufacturing method of the semiconductor device of the another example of the embodiment of the invention.

First, as expressed in FIG. 30A, patterning formation of the $n^-$-type intermediate layer 14 is carried out on the $n^+$-type substrate 12. Then, the mask M4 is appropriately formed on the intermediate layer 14. This corresponds to the processes mentioned above about FIGS. 21 and 22.

Figure 30B:
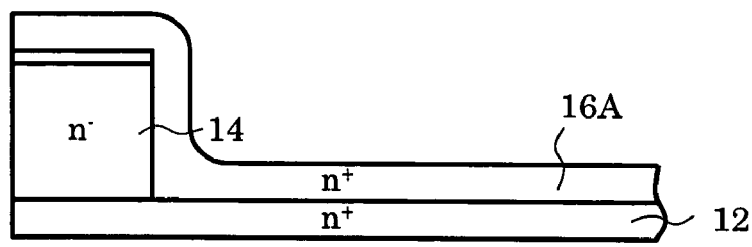

Next, as expressed in FIG. 30B, the $n^+$-type semiconductor layer 16A as the first layer is grown epitaxially. This corresponds to the process mentioned above about FIG. 23. Then, it is also possible to form the thickness of the semiconductor layer 16A in 10 microns or less, or 1 micron or less.

Figure 30C:
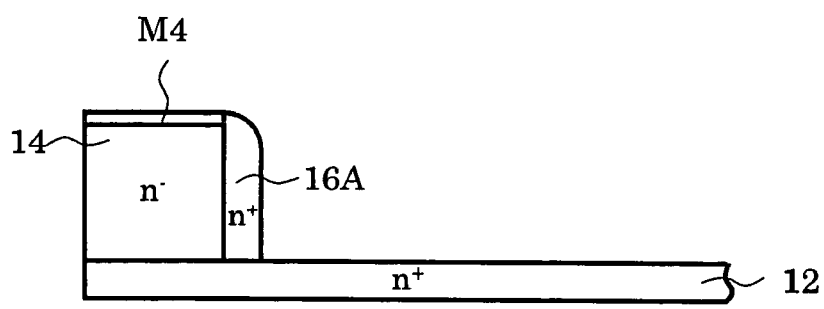

Then, as expressed in FIG. 30C, the $n^+$-type pillar layer 16A as the first layer is formed by anisotropic etching. This corresponds to the process mentioned above about FIG. 24.

Figure 30D:
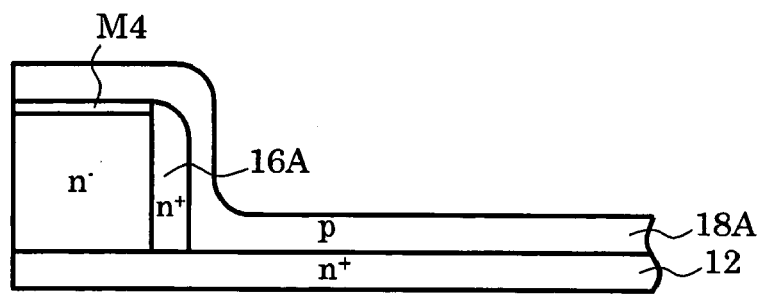
Figure 30E:
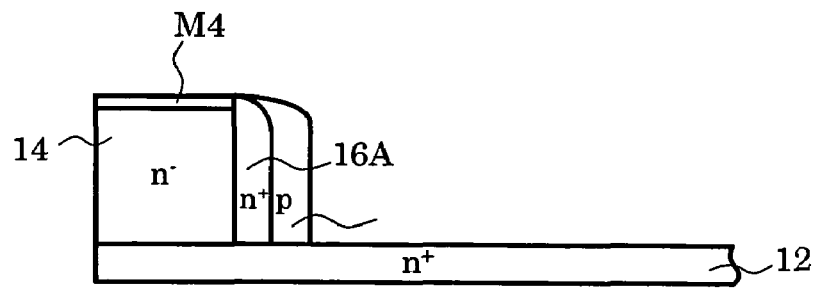
Figure 31A:
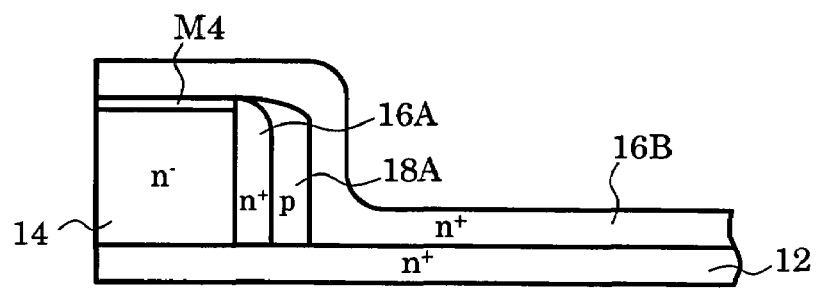
FIGS. 31A through 31D are process section views which illustrate parts of manufacturing method of the semiconductor device of the another example of the embodiment of the invention.
Figure 31B:
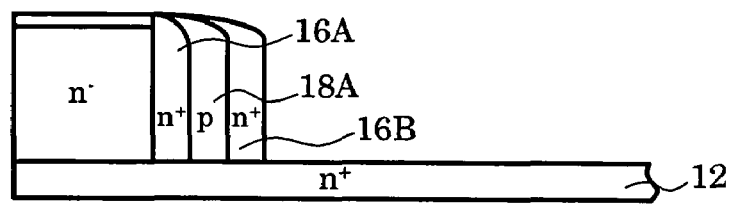
Figure 31C:
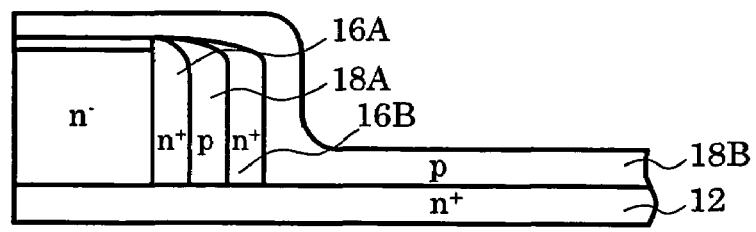
Figure 31D:
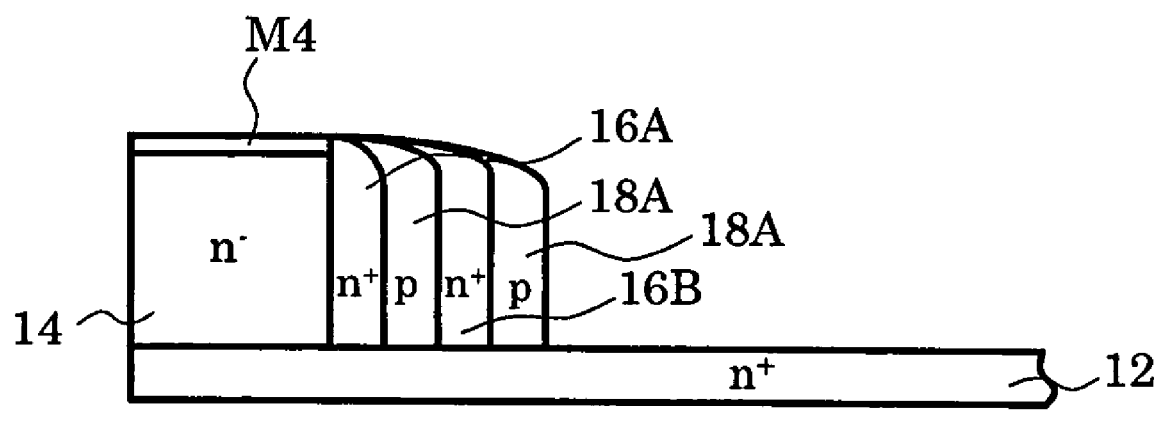

Then, as expressed in FIG. 30D, p-type semiconductor layer 18A as the first layer is grown epitaxially. And as expressed in FIG. 30E, the p-type pillar layer 18A of the first layer is formed by anisotropic etching. Furthermore, as expressed in FIG. 31A, the $n^+$-type semiconductor layer 16A of the second layer is formed. And as expressed in FIG. 31B, the $n^+$-type pillar layer 16B of the second layer is formed by anisotropic etching. Then, by repeating the same processes as shown in FIGS. 31C and 31D, the p-type pillar layer 18B of the second layer, and the $n^+$-type pillar layer of the third layer . . . can be formed adjoining.

According to the manufacturing method explained above, it is possible to reduce the widths (W1 and W2 in FIG. 2) to 10 microns or less, or 1 micron or less as mentioned above, since the $n^+$-type pillar layer 16 and the p-type pillar layer 18 are formed by epitaxial growth. And in this example, many pillar layers which is carried out the minuaturization in this way can be formed adjoining. As the result, it becomes possible to accumulate the cells with high density, and also becomes possible to lower ON resistance ($R_{on}$) sharply.

Heretofore, the embodiments of the present invention have been explained, referring to the examples. However, the present invention is not limited to these specific examples.

Further, also concerning the material, a conductivity type, carrier concentration, impurities, thickness, arrangement relations, a manufacturing method and conditions in each process of each element, those skilled in the art will be able to carry out the invention appropriately selecting a material or a structure within known techniques.

For example, about the concrete structures and manufacturing methods may be appropriately selected by those skilled in the art with the known techniques to carry out the invention as taught in the specification and obtain equivalent effects.

What is claimed is:

1. A semiconductor device comprising:
   a semiconductor layer of a first conductivity type;
   a first semiconductor pillar layer of the first conductivity type provided on a major surface of the semiconductor layer;
   a second semiconductor pillar layer of a second conductivity type provided on the major surface of the semiconductor layer and adjoining the first semiconductor pillar layer;
   a third semiconductor pillar layer of the first conductivity type provided on the major surface of the semiconductor layer and adjoining the second semiconductor pillar layer;
   a forth semiconductor pillar layer of the second conductivity type provided on the major surface of the semiconductor layer and adjoining the third semiconductor pillar layer;
   a fifth semiconductor pillar layer of the first conductivity type provided on the major surface of the semiconductor layer and adjoining the forth semiconductor pillar layer;
   a semiconductor intermediate layer of the first conductivity type whose concentration of impurities is lower than the first, third, and fifth semiconductor pillar layers, provided on the major surface of the semiconductor layer in a surrounding of the first through fifth semiconductor pillar layers;
   a first semiconductor base layer of the second conductivity type provided on the second semiconductor pillar layer;
   a second semiconductor base layer of the second conductivity type provided on the forth semiconductor pillar layer;
   a first semiconductor region of the first conductivity type selectively provided on a surface of the first semiconductor base layer;
   a second semiconductor region of the first conductivity type selectively provided on a surface of the second semiconductor base layer;
   a gate insulating film provided on the first semiconductor base layer between the first semiconductor region and the first semiconductor pillar layer and between the first semiconductor region and the third semiconductor pillar layer, and provided on the second semiconductor base layer between the second semiconductor region and the third semiconductor pillar layer and between the second semiconductor region and the fifth semiconductor pillar layer; and a gate electrode provided on the gate insulating film, each width of the first through fifth semiconductor pillar layers seen in a perpendicular direction to interfaces of p-n junctions formed among the first through fifth semiconductor pillar layers respectively being 10 microns or less.

2. The semiconductor device according to claim 1, wherein each of the first through fifth semiconductor pillar layers are formed in a substantially stripe fashion extending in a parallel direction to the major surface of the semiconductor layer.

3. The semiconductor device according to claim 1, wherein each interface of p-n junctions formed among the first through fifth semiconductor pillar layers are substantially perpendicular to the major surface of the semiconductor layer.

4. The semiconductor device according to claim 1, wherein the semiconductor intermediate layer is also provided on an outer edge of the major surface of the semiconductor layer.

5. The semiconductor device according to claim 1, wherein the first through fifth semiconductor pillar layers have been formed by epitaxial growth.

6. A semiconductor device comprising:
a semiconductor layer of a first conductivity type;
a first semiconductor pillar layer of the first conductivity type provided on a major surface of the semiconductor layer;
a second semiconductor pillar layer of a second conductivity type provided on the major surface of the semiconductor layer, adjoining and surrounding the first semiconductor pillar layer;
a third semiconductor pillar layer of the first conductivity type provided on the major surface of the semiconductor layer, adjoining and surrounding the second semiconductor pillar layer;
a semiconductor intermediate layer of the first conductivity type whose concentration of impurities is lower than the first and third semiconductor pillar layers, provided on the major surface of the semiconductor layer in a surrounding of the third semiconductor pillar layer;
a semiconductor base layer of the second conductivity type provided on the second semiconductor pillar layer;
a semiconductor region of the first conductivity type selectively provided on a surface of the semiconductor base layer;
a gate insulating film provided on the semiconductor base layer between the semiconductor region and the first semiconductor pillar layer and between the semiconductor region and the third semiconductor pillar layer; and
a gate electrode provided on the gate insulating film,
each width of the first through third semiconductor pillar layers seen in a perpendicular direction to a interfaces of p-n junctions formed among the first through third semiconductor pillar layers respectively being 10 microns or less.

7. The semiconductor device according to claim 6, wherein each of the second and third semiconductor pillar layers is formed in a concentric circle fashion centering on the first semiconductor pillar layer.

8. The semiconductor device according to claim 6, wherein each of the second and third semiconductor pillar layers is formed in a concentric loop fashion centering on the first semiconductor pillar layer.

9. The semiconductor device according to claim 6, wherein each interface of p-n junctions formed among the first through third semiconductor pillar layers is substantially perpendicular to the major surface of the semiconductor layer.

10. The semiconductor device according to claim 6, wherein the semiconductor intermediate layer is also provided on an outer edge of the major surface of the semiconductor layer.

11. The semiconductor device according to claim 6, wherein the first through third semiconductor pillar layers have been formed by epitaxial growth.

12. A manufacturing method of a semiconductor device comprising:
forming a trench in a first semiconductor layer of a first conductivity type;
introducing impurities of the first conductivity type into side walls of the trench;
growing a second semiconductor layer of a second conductivity type epitaxially on the side walls and on the bottom of the trench;
introducing the impurities of the first conductivity type into the second semiconductor layer on the bottom of the trench;
growing epitaxially a third semiconductor layer of the first conductivity type on the side walls and on the bottom of the trench covered by the second semiconductor layer;
forming a base layer of the second conductivity type in an upper part of the second semiconductor layer;
forming a region of the first conductivity type on a surface of the base layer selectively;
forming a gate insulating film on the base layer; and
forming a gate electrode on the gate insulating film.

13. The manufacturing method of a semiconductor device according to claim 12, wherein the introducing the impurities of the first conductivity type into the side walls of the trench includes ion implanting the impurity of the first conductivity type with a slant angle to the side walls of the trench.

14. The manufacturing method of a semiconductor device according to claim 12, wherein the introducing the impurities of the first conductivity type into the second semiconductor layer includes ion implanting the impurity of the first conductivity type in a direction substantially perpendicular to the bottom of the trench.

15. A manufacturing method of a semiconductor device comprising:
forming a trench in a first semiconductor layer of a first conductivity type;
forming an epitaxially grown second semiconductor layer of the first conductivity type on a side wall of the trench;
forming an epitaxially grown third semiconductor layer of a second conductivity type on the second semiconductor layer formed on the side wall of the trench;
forming an epitaxially grown fourth semiconductor layer of the first conductivity type on the third semiconductor layer formed on the side wall of the trench;
forming a base layer of the second conductivity type in an upper part of the third semiconductor layer;
forming a region of the first conductivity type on a surface of the base layer selectively;
forming a gate insulating film on the base layer; and
forming a gate electrode on the gate insulating film.

16. The manufacturing method of a semiconductor device according to claim 15, wherein the forming an epitaxially grown second semiconductor layer includes epitaxially growing the second semiconductor layer on the side wall and the bottom of the trench, and removing part of the second semiconductor layer grown on the bottom of the trench.

17. The manufacturing method of a semiconductor device according to claim 15, wherein the forming an epitaxially grown third semiconductor layer includes epitaxially growing the third semiconductor layer on the side wall and the bottom of the trench, and removing part of the third semiconductor layer grown on the bottom of the trench.

18. The manufacturing method of a semiconductor device according to claim 15, further comprising removing the second through fourth semiconductor layers formed outside the trench, before forming the base layer.

* * * * *